Figure 1:
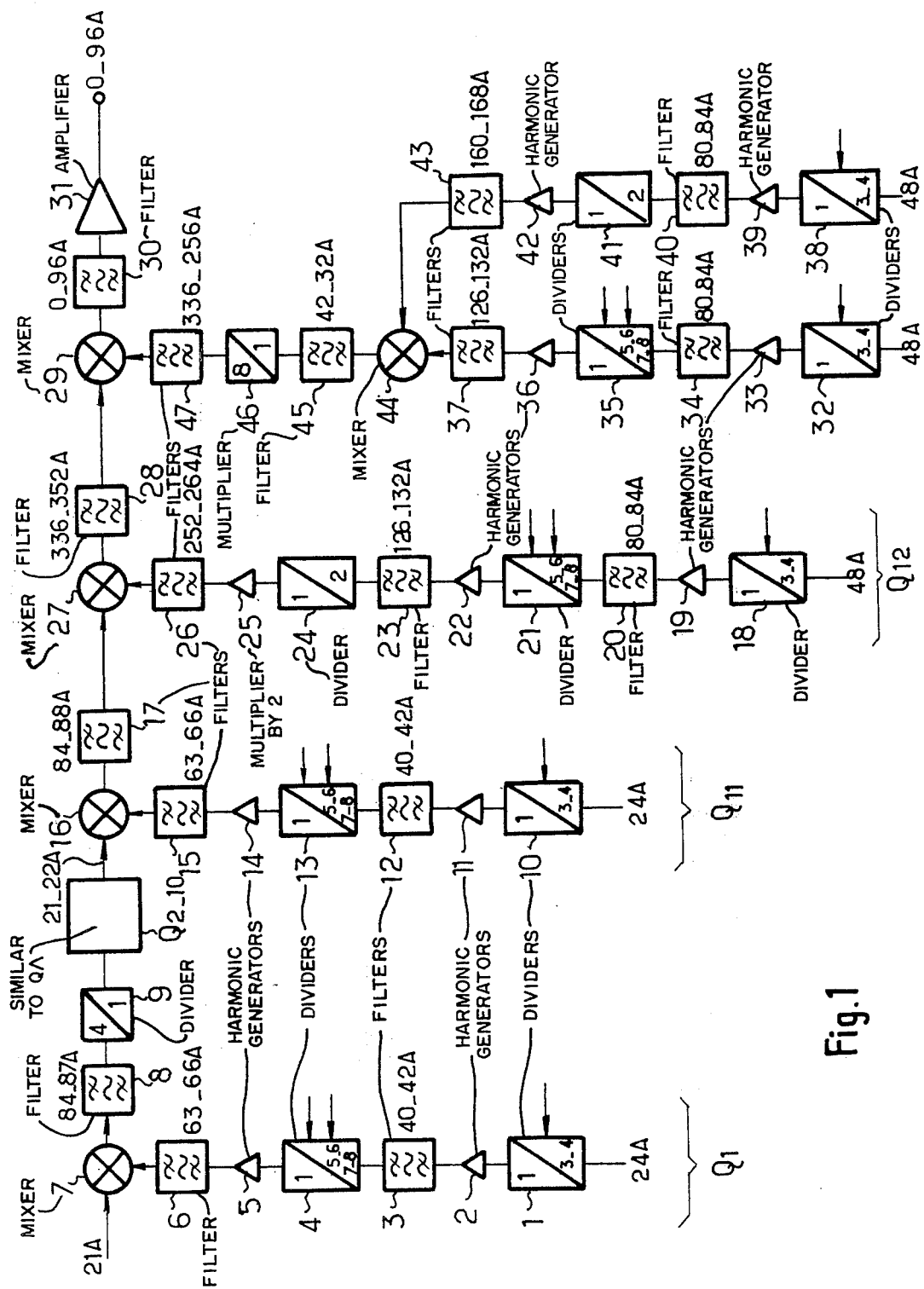

United States Patent [19]

Rémy

[11] 4,008,443
[45] Feb. 15, 1977

[54] QUATERNARY FREQUENCY SYNTHESIZER

[75] Inventor: Joël Rémy, Paris, France

[73] Assignee: Adret Electronic, Trappes, France

[22] Filed: Nov. 14, 1975

[21] Appl. No.: 632,002

Related U.S. Application Data

[63] Continuation of Ser. No. 483,910, June 27, 1974, abandoned.

[30] Foreign Application Priority Data

Mar. 15, 1974 France .............. 74.08948

[52] U.S. Cl. .................. 331/38; 328/14; 331/2; 331/40; 331/51
[51] Int. Cl.² ........................ H03B 21/02
[58] Field of Search ............ 331/22, 31, 38, 39, 331/40, 51, 2; 328/14; 307/271

[56] References Cited

UNITED STATES PATENTS

| | | | |
|---|---|---|---|
| 2,930,988 | 3/1960 | Boff | 331/38 |
| 2,934,716 | 4/1960 | Smith | 331/39 |
| 2,957,144 | 10/1960 | Huhn | 331/40 |
| 3,235,815 | 2/1966 | Keicher | 331/39 |
| 3,372,347 | 3/1968 | Jones et al. | 331/39 |
| 3,566,278 | 2/1971 | Noyes, Jr. | 331/38 |
| 3,644,827 | 2/1972 | Landefeld | 331/39 |

FOREIGN PATENTS OR APPLICATIONS 795,932 10/1968 Canada .................. 331/39

*Primary Examiner*—John Kominski
*Attorney, Agent, or Firm*—Cushman, Darby & Cushman

[57] ABSTRACT

A frequency synthesizer operating in the quaternary system of numeration and comprising a plurality of "quaternade" units, each including a frequency inserting element with a mixer which receives respective frequencies equal to 63 A, 64 A, 65 A and 66 A, A being a predetermined frequency. The said frequencies are generated from a common standard frequency through dividing the standard frequency by variable ratios generating harmonics of the resulting frequencies and filtering.

14 Claims, 3 Drawing Figures

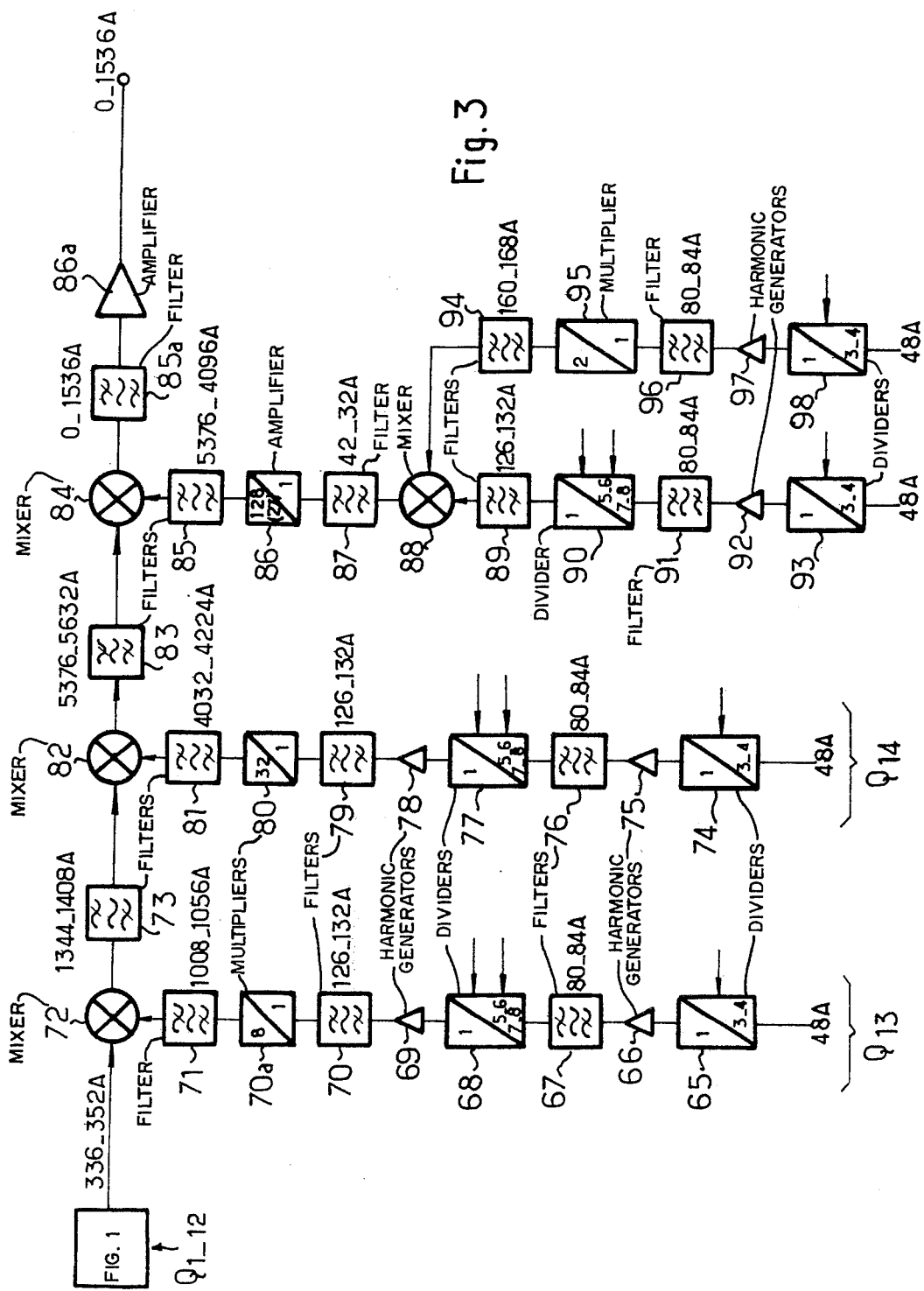

QUATERNARY FREQUENCY SYNTHESIZER

This application is a continuation of my copending application Ser. No. 483,910, filed June 27, 1974, which was abandoned upon the filing hereof.

The invention relates to frequency synthesizers which process a frequency variable by steps from a reference frequency source. The decimal number expressing this frequency is processed digit by digit in a cascade of stages called decades, each of which has an element for inserting a variable frequency increment.

In a first and second type of synthesizer called respectively "direct synthesis" and "phase locking loop" synthesizers the inserting element comprises a mixer which receives the frequency processed by the previous decades and the beat is filtered and divided by 10. Therefore each local increment is divided by $10^n$, $n$ being the number of stages following that where it is inserted.

A third type called a "logic synthesis" synthesizer uses an element called a bit rate multiplier for processing the discrete multiple frequencies of the step.

Each of these three synthesizer types has advantages and disadvantages. The first type provides short frequency acquisition times (e.g. 20 microseconds), but its construction is complicated, its reliability mediocre and phase stability of the synthesized frequency can only be obtained by means of onerous precautions.

The second type which is much simpler and more reliable than the first has the disadvantage of providing an acquisition time of about one millisecond.

The third type is only able to synthesize frequency ranges limited to a few MHz and with only a mediocre spectral purity. Moreover, the acquisition time can be of the order of one microsecond.

The object of the invention is a new type of frequency synthesizer able to synthesize frequencies covering all the ranges obtained with existing synthesizers, with an acquisition time comparable to that of logic synthesis synthesizers. The present synthesizer is of simple and reliable construction, provides great spectral purity and can be programmed in pure binary notation.

The synthesizer according to the invention comprises a plurality of cascade-mounted stages, each of which has an element for inserting a variable frequency increment, so as to be able to synthesize the successive significant digits of the number expressing the frequency to be measured, in which the said inserting element comprises a mixer effecting the beat between a first frequency from the preceding stage and consisting of a fixed portion and an overall variable increment equal to the sum of the local increments introduced by the preceding stages and a second frequency consisting of a fixed portion and a local variable increment comprising four frequencies which succeed one another with constant steps.

Such a synthesizer operates on the basis of the number 4 which, as will be shown hereinafter, simplifies its construction and programming.

According to a preferred embodiment a frequency divider for dividing by 4 is placed between the output of each of the stages and the input of the following stage.

Therefore the fixed portion of the said first frequency is the same at the input of each of the stages, whilst the local increments of the preceding stages are divided by 4 and are therefore staggered by one position in the numbering system based on 4.

The generation of the four steps of each local increment is preferably obtained starting from at least one reference frequency itself a multiple of the step and by dividing this reference frequency by four appropriate ratios using a variable quantity divider. In the following, each circuit supplying the local increment is designated as a "channel."

Figure 2:
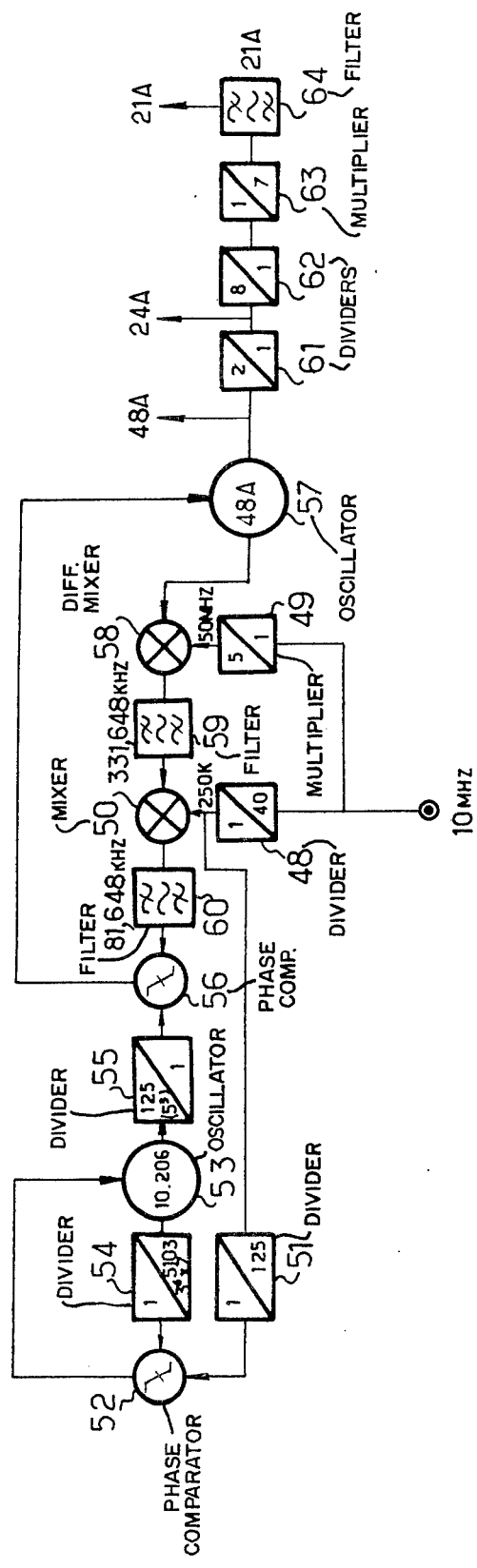

Other features as well as the advantages of the invention can be gathered from the following description and drawings, wherein show:

FIG. 1 a first embodiment of a synthesizer of a preferred embodiment of the invention, FIG. 2 a second embodiment relative to synthesizer covering a wide frequency range, FIG. 3 a time base circuit for supplying the clock frequencies necessary for the operation of these two synthesizers.

FIG. 1 shows a synthesizer which initially comprises ten identical stages, whereof only the first is shown, the others being designated by the reference $Q_{2-10}$. Each stage comprises a channel and a mixer.

The first channel $Q_1$ comprises a divider variable by 3 or 4, designated by the reference numeral 1, receiving an input frequency equal to 24 A, A being equal to $4^{10}$Hz. The divider output frequency of 6 to 8 A acts on a harmonic generator 2 followed by a band pass filter 3 which selects the harmonics equal to 40 and 42 A (namely harmonic 5 of 8 A and harmonic 7 of 6 A). A second divider 4 has a ratio programmable to one of the values 5, 6, 7 or 8. Thus, the output frequencies 5 A, 6 A, 7 A and 8 A are obtained which act on a second harmonic generator 5 followed by a band pass filter 6, which selects four harmonics in arithmetic progression of base A, from 63 to 66 A (harmonic 9 of 7 A, 8 of 8 A, 13 of 5 A and 11 of 6 A). The output frequency of filter 6 is mixed in 7 at an input frequency equal to 21 A. The output frequency of the mixer variable between 84 and 87 A by steps equal to A is filtered in 8, then divided by 4 in a fixed divider 9. Thus, at the output of the circuit a frequency is obtained which is variable between 21 A and $(21 A + 3A/4A)$ in steps equal to A/4. In other words the stage supplies the four frequencies 21 A, 21 A + A/4, 21 A + 2 A/4 and 21 A + 3 A/4. By analogy with the term "decades" used to designate a conventional synthesizer stage supplying 10 values of the type Fo, Fo + P/10, Fo + 2P/10, . . . Fo + 9P/10, such a circuit will be called a "quaternade" hereinafter.

Thus, by designating the clock frequency 21 A by Fo the output frequency of the quaternade is of the form Fo + (NA/4). A being an integer and N can have the discrete values 0, 1, 2 or 3.

When n quaternades are connected in cascade the output frequency of the last one is of the form $$Fo + \frac{N_1 A}{4^n} + \frac{N_2 A}{4^{n-1}} + \cdots Nn/4$$

In this formula $N_1, N_2 \ldots N_n$ result from programming the two dividers of each of the quaternades and assume one of the four values 0, 1, 2 or 3.

In the circuit comprising the quaternades $Q_1$ to $Q_{10}$, A is equal to $4^{10}$ Hz and $n$ is equal to 10. The output frequency of $Q_{10}$ varies between 21 and 22 A per step of 1 Hz, so that the chain $Q_1 - Q_{10}$ supplies $4^{10}$ steps.

Each quaternade supplies four steps, each covering four steps of the previous quaternade.

An 11th quaternade $Q_{11}$ is provided which comprises a divider 10 by 3 or 4, a harmonic generator 11, filter 12, divider 13 by 5, 6, 7 or 8, harmonic generator 14, filter 15, mixer 16 and output filter 17. The only difference between $Q_{11}$ and any one of the other quaternades $Q_1$ to $Q_{10}$ is that it has no output divider by 4. Therefore the output frequency of $Q_{11}$ varies between 84 and 88 A per 1 Hz step.

A 12th quaternade $Q_{12}$ comprises the divider 18 by 3 or 4, harmonic generator 19, filter 20, divider 21 by 5, 6, 7 or 8, harmonic generator 22, filter 23, divider 24 by 2, multiplier 25 by 2, filter 26, mixer 27 and filter 28.

The input frequency of $Q_{12}$ is taken to be equal to 48 A, so that at the output of filter 23 the frequency takes one of the values 126, 128, 130 or 132 A, whilst the output frequency of filter 26 takes one of the values 252, 256, 260 or 264 A.

Finally the output frequency of filter 28 covers without discontinuity the range 336 to 352 A by 1 Hz steps.

$Q_{12}$ is followed by an output circuit comprising a mixer 29 followed by a filter 30 which is itself followed by an output amplifier 31. The mixer 29 receives on the one hand the frequency 336 to 352 A from 28 and on the other a frequency variable between 336 and 256 A by steps equal to 16 A produced in the following way.

A frequency assuming one of the values 126, 128, 130 or 132 A is produced from an input frequency of 48 A in a chain comprising elements 32 to 37, respectively identical to elements 18 to 23.

A frequency assuming one of the two values 160 and 160 A is produced from the frequency 48 A by a chain comprising a divider 38 by 3 or 4, harmonic generator 39, filter 40, divider 41 by 2, harmonic generator 42 and filter 43. The difference beat between the output frequencies of filters 37 and 43 is performed in a mixer 44 followed by a filter 45. Thus, at the output of filter 45 is obtained one of the frequencies $32 A = (160 - 128) A; 34 A = (160 - 126) A; 36 = (168 - 132) A; 38 = (168 - 130) A; 40 = (168 - 128) A$ and $42 = (168 - 126) A$.

By multiplying by 8 in 46 and filtering in 47 one of the six frequencies 256, 272, 288, 304, 320 and 336 A is obtained.

The difference beat effected by mixer 29 and filter 30 gives an output frequency variable between 0 and 96 A per 1 Hz step, i.e. 0 to 100,666,296 Hz.

The clock frequencies 21, 24 and 48 A are easily obtained from a fixed synthesizer.

As an example such a synthesizer is shown in FIG. 2. A round figure frequency of 10 MHz supplied by a crystal is divided by 40 (divider 48) and multiplied by 5 (multiplier 49). The 250 KHz output of divider 48 is applied both to a mixer 50 and to a phase comparator 52 via a divider 51 by 125. The output of comparator 52 controls the frequency of an oscillator 53 whose output after dividing by $3^6 \times 7 = 5103$ in a divider 54 at the other input of mixer 50. The frequency of oscillator 53 is thus controlled by the value 10,206 KHz. After dividing by $5^3 = 125$ (divider 55) it acts on phase comparator 56, whose output controls the frequency of an oscillator 57. The output frequency of oscillator 57 is applied to a difference mixer 58 which also receives the frequency of 50 MHz from multiplier 49. The beat $F_{57} - 50$ MHz is filtered in 59 and applied to mixer 50. The difference beat $F_{57} - 50$ MHz $- 250$ KHz from mixer 50, after filtering in 60, is applied to phase comparator 56, therefore $F_{57} - 50$ MHz $- 250$ KHz $= 10,206$ KHz/125 and $F_{57} = 50,331,648$ KHz $= 48 A$.

By dividing by 2 (divider 61) the frequency 24 A is obtained and by dividing by $8 \times 1/7$ (elements 62, 63 followed by filter 64) frequency 21 A.

The construction of all the components and elements shown in the drawings is within the scope of the skilled expert. The frequency multipliers (or harmonic generators) can be of the known type with recovery time diodes. In view of the frequency plan adopted the band pass filters are very easy to design. The variable quantity dividers can comprise shift registers with parallel synchronous inputs or alternatively decimal counters controlled with the aid of a simple logic device from binary signals then programming.

As an example it is possible to use a shift register with parallel synchronous inputs of the type realised in the form of integrated circuit No. 7495 A whose clock inputs $C_1$ and $C_2$ are interconnected, whilst the operating mode control input is connected to the output $Q_D$.

When three of the parallel inputs B, C and D are connected to earth and the fourth input is placed parallel with logic level 0 and series input SI at level 1, it is easy to demonstrate that at $Q_D$ pulses of frequency F/5 are collected, whereby F is the frequency of the pulses applied at $C_1$, $C_2$.

To obtain a division rate by 4 it is sufficient to connect input A at level 1. Division rates by 3 or 2 can also be obtained by placing appropriate logic levels at inputs A, B, C and D.

It is pointed out that the dividers can be programmed by means of binary signals supplied by a computer or control unit by shifting by one position.

It is easy to show that in a synthesizer operating on the basis of the number 4 a number of frequency steps is obtained which is much higher, for a given number of insertion elements, than in a decimal synthesizer. The number of active components in the circuit is reduced. Moreover, in the circuits described their nature is such that the spectral purity of the frequency generated is not impaired.

During a change in the rated value of any one of the variable quantity dividers the new frequency is established with a time lag corresponding to that provided by the filters. In the examples described this acquisition time is less than 1 microsecond.

This acquisition time makes it possible to envisage new applications for the synthesizer such as research on the frequency, wobbling, digital frequency modulation connected with programming.

In FIG. 3 the block $Q_{1-12}$ represents a circuit comprising twelve quaternades identical to those of FIG. 1, which supplies a frequency variable in steps of 1 Hz from 336 to 352 A.

A 13th quaternade $Q_{13}$ comprises a divider 65 by 3 or 4 followed by a harmonic generator 66 and a filter 67. Thus from the frequency of 48 A divided by 3 or 4 two frequencies 80 and 84 A are obtained, which are applied to a divider 68 by 5, 6, 7 or 8 followed by a harmonic generator 69 and a filter 70. Consequently four frequencies are obtained 126, 128, 130 and 132 A, multiplied by 8 in 70a. At the output of filter 71 the four frequencies 1008, 1024, 1040 and 1056 A are applied to a mixer 72 which supplies, by sum beat with the output of block $Q_{1-12}$ a frequency variable in 1 Hz steps from 1344 to 1408 A at the output of filter 73.

A 14th quaternade $Q_{14}$ comprising a divider 74 by 3 or 4, harmonic generator 75, filter 76, divider 77 by 5, 6, 7 or 8, harmonic generator 78, filter 79, multiplier 80 by 32, filter 81, sum mixer 82 and filter 83 supplies a frequency variable from 5376 to 5632 A in 1 Hz steps. Finally an output circuit comprising a difference mixer 84 followed by a filter 85a and an amplifier 86a supplies a frequency variable from 0 to 1536 A (i.e. 1,610,612,736 Hz in 1 Hz steps).

Mixer 84 receives both the output frequency of filter 83 and the output frequency of a difference mixer 88 after filtering in 87 and multiplying by $2^7 = 186$ in 86, followed by filtering in 85. Mixer 88 receives both the output of a chain comprising a divider 93 by 3 or 4, a harmonic generator 92, a filter 91, a divider 90 by 5, 6, 7 or 8 and a filter 89, as well as the output of a chain comprising a divider 98 by 3 or 4, a harmonic generator 97, a filter 96 a multiplier 95 by 2 and a filter 94.

The circuit comprising components 87 to 98, which is identical to the circuit comprising components 32 to 44 of FIG. 1, supplies the six frequencies 32, 34, 36, 38, 40 and 42 A which, by multiplying by 128, give six frequencies ranging between 5376 and 4096 A by 256 A steps. As the 13th quaternade gives four large 16 A steps, the 14th quaternade four large 64 A steps and the output circuit six large 256 A steps, the complete output range is covered without any discontinuity.

The frequencies of 21, 24 and 48 A used in the circuit of FIG. 3 could be generated by the circuit of FIG. 2.

It must be understood that numerous constructional variants of the quaternary synthesizer forming the object of the invention can be envisaged by the skilled expert. It is common to all these variants that in certain of the stages at least the local increment insertion element supplies four frequencies which follow one another with a constant step, whereby this step represents for $n$ stages $4^n$ times the smallest frequency step which the device can supply. The quaternade mixer is preferably a sum mixer and the frequency supplied by the insertion element then comprises a fixed portion equal to three times the fixed portion of the frequency supplied by the preceding stage. However, a difference mixer could be used, when the fixed portion of the local frequency would have to be equal to five times that of the frequency supplied by the previous stage.

In the same way the frequency divider by four placed between each of the stages can be eliminated in certain arrangements. It has the effect of dividing by four the fixed portion and the overall increment of the input frequency of the insertion element in order to shift the said increment by one position in the notation system based on 4.

Various modifications of detail can be envisaged. Thus, the frequencies 40 and 42 A could be obtained for example (FIG. 1) from a clock frequency of 30 A by dividing by 5 or 6 and by selecting by filtering the harmonic 8 of 5 A and the harmonic 7 of 6 A.

Although the arrangements described are not of the direct synthesis type a direct synthesis quaternary synthesizer could also be constructed.

I claim:

1. A frequency synthesizer generating a resultant frequency of precise value expressed in a number of base 4, comprising:
   $n$ selective mixing means respectively numbered 1 to $n$, where $n$ is an integer greater than 1, having respective first and second inputs and respective outputs, the first input of the first mixer being fed with a fixed reference frequency signal, the first input of the $i^{th}$ mixer (with $i = 2, 3 \ldots n$) being coupled to the output of the $(i - 1)^{th}$ mixer, said synthesizer further comprising:
   a plurality of signal-translating channels numbered 1 to $n$ for selecting in each channel a digit to appear in said resultant frequency,
   each channel comprising means for producing from a single given frequency an individual frequency having an accurately controlled value equal to one among only four frequency values in arithmetical progression which is fed to the said respective second inputs, and
   each said channel comprising at least one variable factor dividing means coupled in series with fixed passband filtering means, said single frequency being applied to said dividing means.

2. A frequency synthesizer according to claim 1, wherein the smallest of said four values in arithmetical progression is equal to K times the frequency of said fixed frequency signal, K being equal to one of the values 3 and 5.

3. A synthesizer according to claim 1, in which said four frequency values of each channel are identical from one channel to the next, and $n$ frequency dividers of fixed ratio equal to 4 are respectively coupled in series at the outputs of said mixers.

4. A frequency synthesizer according to claim 3, comprising a further selective mixing means having a first input fed by said fixed frequency divider coupled to said $n^{th}$ mixing means, and a second input, and a further channel identical with said $n$ channels, and feeding said second input of said further mixing means.

5. A synthesizer according to claim 4, further comprising an output stage built up of a mixer having a first input coupled to the last mixing means and a second input, and of a further channel comprising means for generating six frequencies in arithmetic progression, said last mentioned means comprising two chains supplying respectively four frequencies in arithmetic progression and two frequencies in arithmetic progression, and means for feeding said second input of said mixer with a signal, the frequency of which is the sum of said frequencies supplied by said chain, each of said chains comprising at least one controllable factor dividing means followed by a pass-band filter.

6. A frequency synthesizer according to claim 1, wherein each channel comprises at least one harmonic generating means for generating coupled in series between said dividing means and said fixed pass-band filtering means and supplying the latter with a multiplicity of frequencies each of which except one is outside of said pass band of said filtering means.

7. A frequency synthesizer generating a resultant frequency of precise value expressed in a number of base 4, comprising:
   $n$ selective mixing means respectively numbered 1 to $n$, where $n$ is an integer greater than 1, having respective first and second inputs and respective outputs, the first input of the first mixer being fed with a fixed reference frequency signal, the first input of the $i^{th}$ mixer (with $i = 2, 3 \ldots n$) being coupled to the output of the $(i - 1)^{th}$ mixer, said synthesizer further comprising:
   a plurality of signal-translating channels numbered 1 to $n$ for selecting in each channel a digit to appear in said resultant frequency, each channel comprising means for producing from a single given frequency an individual frequency having an accurately controlled value equal to one among four frequency values in arithmetical progression, each channel further comprising in series:
a first controllable dividing means, to which is applied said single frequency, the dividing factor being selectable among two given values,
a first harmonic generator,
a first fixed pass-band filtering means adapted for selecting two successive harmonics of said generator,
a second controllable dividing means, the dividing factor of which is selectable among four given values,
a second harmonic generator, and
a second fixed pass-band filtering means adapted for selecting four successive harmonics of said second generator.

8. A synthesizer according to claim 7, in which said selective means are sum mixers, and said four harmonics are respectively 63 A, 64 A, 65 A and 66A, A being the base of said arithmetic progression, and said reference frequency and single frequency being respectively equal to 21 A and 24 A.

9. A synthesizer according to claim 8, in which the said first filtering means are adapted for selecting harmonics 40 A and 42 A and in which said four dividing factors given values are 5, 6, 7 and 8, the frequency 40 A being divided by 5 or 8 and the frequency 42 A by 6 or 7.

10. A synthesizer according to claim 9, in which said first dividing means factors are equal to 3 and 4, the frequencies selected by said first filtering means being the fifth and the seventh harmonics.

11. A synthesizer according to claim 7, in which said selective mixing means are sum mixers, and said four harmonics are respectively 63 A, 64 A, 65 A and 66 A, the A being the base of said arithmetic progression, and said reference frequency and single frequency being respectively equal to 21 A and to 30 A.

12. A synthesizer according to claim 11, in which the said first filtering means are adapted for selecting harmonics 40 A and 42 A and in which said four dividing factors given values are 5, 6, 7 and 8, the frequency 40 A being divided by 5 or 8 and the frequency 42 A by 6 or 7, and in which said first dividing means factors are equal to 5 and 6, the frequencies selected by said first filtering means being the seventh and eighth harmonics.

13. A synthesizer according to claim 7, in which said selective mixing means are difference mixers, and said four harmonics are respectively 105 A, 106 A, 107 A and 108 A, the A being the base of said arithmetic progression.

14. A frequency synthesizer generating a resultant frequency of precise value expressed in a number of base 4, comprising:
$n$ selective mixing means respectively numbered 1 to $n$, where $n$ is an integer greater than 1, having respective first and second inputs and respective outputs, the first input of the first mixer being fed with a fixed reference frequency signal, the first input of the $i^{th}$ mixer (with $i = 2, 3 \ldots n$) being coupled to the output of the $(i - 1)^{th}$ mixer, said synthesizer further comprising:
a plurality of signal-translating channels numbered 1 to $n$ for selecting in each channel a digit to appear in said resultant frequency and producing from a single given frequency an individual frequency having an accurately controlled value equal to one among only four frequency values in arithmetical progression, and
each of said channels comprising fixed band pass filtering means for passing any of said four frequencies to the said second inputs of respective said mixing means, and means including at least one variable factor dividing means coupled as an input to said fixed pass-band filtering means, said single frequency being applied to said dividing means, for developing a signal containing only one of said frequency values to cause said individual frequency to be produced by said filtering means.

* * * * *